United States Patent [19]
Butuzov et al.

[11] 3,960,501
[45] June 1, 1976

[54] APPARATUS FOR GROWING CRYSTALS FROM HYDROTHERMAL SOLUTIONS

[76] Inventors: Vladimir Petrovich Butuzov, Sirenevy bulvar 45, kv. 55, Moscow; Evgeny Konstantinovich Vatolkin, Vokzalnaya ulitsa 20, kv. 6, Alexandrov Vladimirskoi oblasti; Leonid Alexandrovich Gordienko, Bolshaya Semenovskaya ulitsa 21, kv. 87, Moscow; Ernst Borisovich Feldman, Snaiperskaya ulitsa 5, kv. 20, Moscow; Valentin Evstafievich Khadzhi, ulitsa Institutskaya 14, kv. 8, Alexandrov Vladimirskoi oblasti; Anatoly Alexandrovich Shaposhnikov, 5 Vatutinsky pereulok 31, kv. 10, Moscow, all of U.S.S.R.

[22] Filed: Jan. 15, 1974

[21] Appl. No.: 433,495

[52] U.S. Cl. .......................... 23/273 H; 156/623 Q; 23/290
[51] Int. Cl.² ...................... B01D 9/02; B01J 17/04
[58] Field of Search ............... 23/273, 273 H, 290; 156/623 Q, 623

[56] References Cited
UNITED STATES PATENTS

| | | |
|---|---|---|
| 1,746,144 | 2/1930 | Christopher ..................... 23/273 R |
| 2,604,385 | 7/1952 | Chambers ........................ 23/273 R |
| 2,895,812 | 7/1959 | Kohman ........................... 23/273 R |
| 3,013,867 | 12/1961 | Sawyer ............................. 23/273 R |
| 3,051,558 | 8/1962 | Jost .................................. 23/273 R |
| 3,253,893 | 5/1966 | Sawyer ............................. 23/273 R |
| 3,271,114 | 9/1966 | Kolb ................................. 23/273 R |

*Primary Examiner*—Wilbur L. Bascomb, Jr.
*Assistant Examiner*—S. J. Emery
*Attorney, Agent, or Firm*—Haseltine, Lake & Waters

[57] ABSTRACT

An apparatus for growing crystals from hydrothermal solutions comprises a vertically extending autoclave having a crystallization zone in its top portion and a dissolution zone in its bottom portion. The autoclave is surrounded by a heat insulation layer, is provided with a system of heating elements and is enclosed in a thermostatically controlled chamber which is divided into vertically extending sections. Each section is provided with a heating and thermostatic control system so as to ensure the maintenance of constant and different temperature values in each section required to create and maintain the desired temperature fields in the crystallization and dissolution zones of the autoclave.

2 Claims, 2 Drawing Figures

APPARATUS FOR GROWING CRYSTALS FROM HYDROTHERMAL SOLUTIONS

The invention relates to the equipment to be used in producing synthetic crystals, and more particularly to apparatus for growing crystals from hydrothermal solutions, and it may be successfully used for the synthesis of high-grade crystals, in particular piezooptic quartz on a commercial scale.

Known in the art is an apparatus for growing crystals from hydrothermal solutions comprising a vertically extending closed autoclave having a crystallization zone in its top portion to accommodate seeding plates and a dissolution zone in its bottom portion to accomodate a charge. During the crystallization crystals are formed on the seeding plates due to the charge transfer.

The autoclave is surrounded by heat insulation layer and is provided with a system of heating elements. The heat insulation and the heating elements ensure the provision in the autoclave of two isothermic zones with a high temperature gradient therebetween, which are necessary for running the crystallization process. For that purpose the heat insulation layer is divided into two sections corresponding to the dissolution zone and to the crystallization zone with a heat insulating partition wall therebetween. The heat insulation layer of the dissolution zone is made sufficiently thick of a material having low coefficient of thermal conductivity, and the heat insulation layer of the crystallization zone is made thinner, so as to enable heat removal from the top portion of the autoclave, while the partition wall between the heat insulation sections is made of a material having low coefficient of thermal conductivity.

It is known that the quality of crystals obtained, especially of those obtained with long-term growing cycles, largely depends on the stability of growth parameters, such as pressure and temperature in the crystallization and dissolution zones, and hence on the temperature difference between the zones. Furthermore, in order to obtain high-grade crystals over the entire volume of the crystallization zone, uniform distribution of temperature should be provided along the height and diameter of the crystallization and dissolution zones, that is temperature gradients with each zone should be eliminated. In this case constant concentration fields are obtained within the crystallization and dissolution zones, respectively.

In the prior-art apparatus, fluctuations of the temperature conditions of the environment (daily and seasonal fluctuations, as well as those due to the technical reasons) result in changes of the temperature, and hence concentration fields in the crystallization and dissolution zones of the autoclave, and while the control enables the establishment of initial parameters of growth, such temporary fluctuations result in zonation, that is, in non-uniformity of the grown material due to the gradient of concentration of an impurity in the crystals.

In addition, in order to obtain the desired temperature fields in the crystallization and dissolution zones in the prior-art apparatus, it is necessary to select the structure and material of the heat insulation with a rather high precision.

Known in the art is also an apparatus for growing crystals from hydrothermal solutions comrising a vertically extending autoclave having a crystallization zone in its top portion and a dissolution zone in its bottom portion. The autoclave is surrounded by a heat insulation layer, provided with a system of heating elements and enclosed in a thermostatically controlled chamber. The thermostatically controlled chamber comprises an additional heat insulation protective structure disposed around the heat insulation layer of the autoclave so that a blower controlled air layer is provided between the protective structure and heat insulation layer of the autoclave a temperature transducer being placed in said air layer.

Upon a change in the temperature of the air layer between the heat insulation layer of the autoclave and the additional heat insulation layer the amount of air fed by the blower is either increased, or reduced depending upon the signal from the temperature transducer so that a constant temperature of said air layer is maintained, whereby the influence of fluctuations of the ambient temperature (daily and seasonal fluctuations, as well as those due to technical reasons) on the temperature fields in the crystallization and dissolution zones of the autoclave is reduced.

However, the thermostatically controlled chamber of this apparatus is common for the both zones of the autoclave and cannot be efficiently used to provide the desired temperature and concentration fields in the crystallization and dissolution zones of the autoclave. Furthermore, in order to obtain desired the temperature fields in the zones of the autoclave in this apparatus, it is necessary to precisely know a priori the structure and material of the heat insulation layer, which is very difficult in practice. Since the air flow in the thermostatically controlled chamber moves from the bottom up along the entire height of the autoclave, heat losses from the dissolution zone are increased, whereas a predetermined heat removal from the crystallization zone with minimum heat losses for the dissolution zone constitutes an important requirement for growing crystals from hydrothermal solutions. In order to ensure a required heat removal from the top portion of the autoclave, the heat insulation layer of the crystallization zone may be made rather thin. In this case the air layer temperature control in the zone directly adjacent to the heat insulation layer of the autoclave may result in changes in the temperature of the crystallization zone depending upon fluctuations of the environment temperature so that the efficiency of the above-described apparatus is reduced.

It is an object of the invention to provide an apparatus for growing crystals from hydrothermal solutions which ensure the creation and maintenance of the desired temperature and concentration fields within the crystallization and dissolution zones during the entire long-term crystallization cycle.

This object is accomplished due to the fact that in an apparatus for growing crystals from hydrotehrmal solutions, comprising a vertically extending autoclave having a crystallization zone in its top portion and a dissolution zone in its bottom portion, said autoclave being surrounded by a heat insulation layer, provided with a system of heating elements and enclosed in a thermostatically controlled chamber, according to the invention, the thermostatically controlled chamber is divided into vertically extending sections, each section being provided with a heating and thermostatic control system so that constant and different temperature values can be maintained in said sections which are required to create and maintain the desired temperature fields in the crystallization and dissolution zones of the autoclave.

The sections of the thermostatically controlled chamber may have double walls, and the heating and thermostatic control system may comprise means for maintaining a constant temperature in the space between the walls.

In another embodiment the sections of the thermostatically controlled chamber may also have double walls, and the heating and thermostatic control system may comprise means for maintaining a constant temperature of the inner wall.

The thermostatically controlled chamber is preferably provided with a separate section embracing from the outside the locking portion of the autoclave so as to ensure the desired temperature conditions for reliable operation of the lock parts.

This apparatus makes it possible to create the desired temperature and concentration fields within the crystallization and dissolution zones and to maintain them constant during long-term growing cycles.

This is accomplished due to the fact that the desired temperature values are set up and maintained in the sections of the thermostatically controlled chamber without changes in the shape and material of the heat insulation layer which would require labour-consuming assembly work. The apparatus according to the invention minimizes heat losses from the dissolution zone, whereby a required heat removal from the crystallization zone is ensured. The use of double walls of the thermostatically controlled chamber and means for maintaining a required constant temperature therebetween, or a required temperature of the inner wall make it possible to set up and maintain the desired constant temperature conditions at any required boundaries with the environment which are defined by the arrangement of the double walls so that the influence of the temperature control in the sections of the thermostatically controlled chamber on the temperature fields in the autoclave is practically eliminated.

The use of a separate section of the thermostatically controlled chamber embracing from the outside the locking portion of the autoclave provides for the creation of the desired temperature conditions required for reliable operation of the lock parts, whereby the operability of the apparatus is improved.

The invention will now be described with reference to specific embodiments thereof illustrated in the accompanying drawings, in which.

Figure 1:
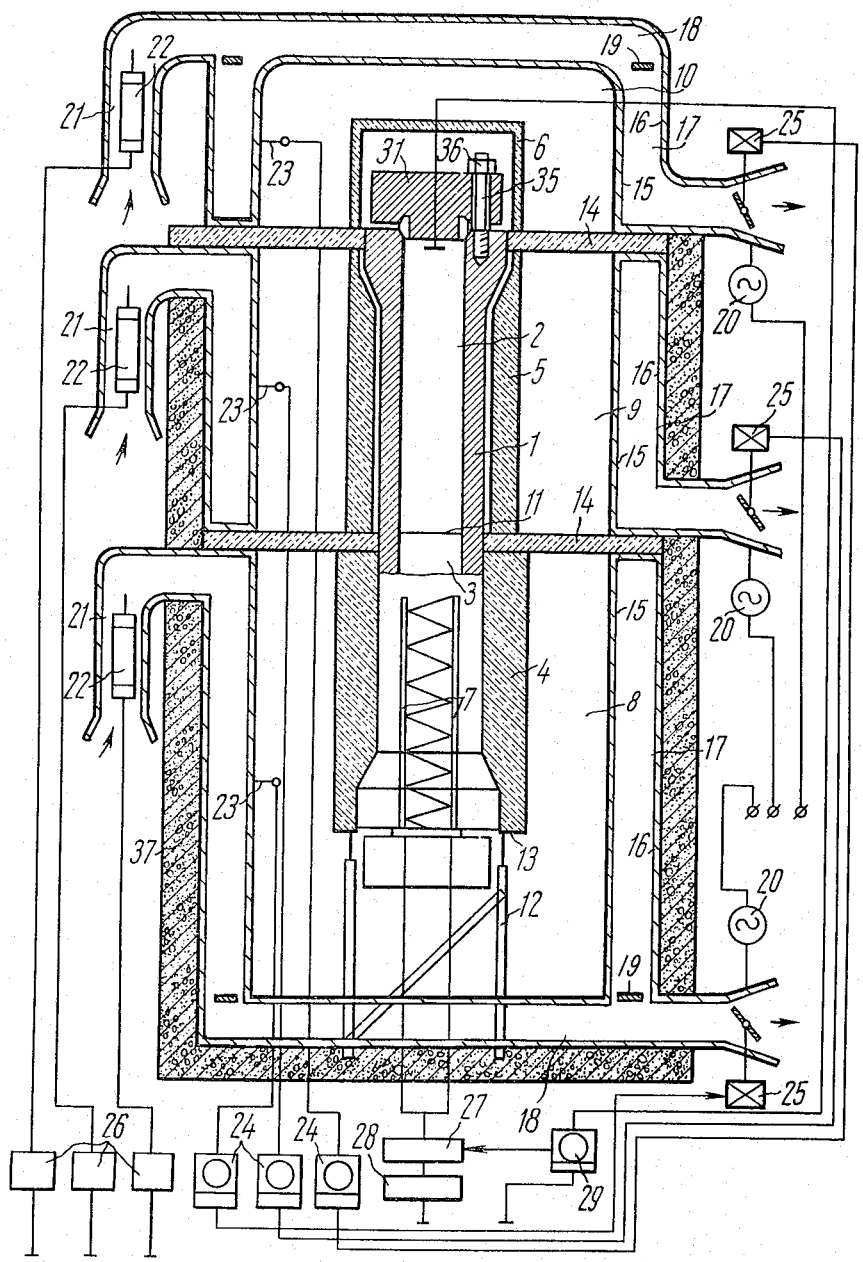
FIG. 1 shows a longitudinal section of an apparatus for growing crystals from hydrothermal solutions according to the invention.

The apparatus for growing crystals from hydrothermal solutions comrises a vertically extending autoclave 1 (FIG. 1) having a crystallization zone 2 in its top portion and a dissolution zone 3 in its bottom portion, the autoclave being surrounded by a heat insulation layer 4 corresponding to the dissolution zone 3, a heat insulation layer 5 corresponding to the crystallization zone 2 and a heat insulation layer 6 embracing the locking portion of the autoclave 1. The autoclave 1 is provided with a system of heating elements 7 and is enclosed in a thermostatically controlled chamber divided into vertically extending section 8, 9, 10. The section 8 of the thermostatically controlled chamber embraces the dissolution zone 3, the section 9 — the crystallization zone 2, and the section 10 — the locking portion of the autoclave. The crystallization zone 2 of the autoclave 1 is separated from the dissolution zone 3 by means of a diaphragm 11, the degree of closing of the diaphragm effecting the intensity of the mass exchange between the dissolution zone 3 and the crystallization zone 2.

The autoclave 1 is mounted on a support 12. A heat insulation layer is provided between the bottom end wall of the autoclave 1 and the upper side of the support 12.

The sections 8, 9, 10 of the thermostatically controlled chamber are separated from each other by heat insulation partition walls 14. The sections 8, 9, 10 of the thermostatically controlled chamber are provided with double metallic walls — the inner walls 15 and the outer walls 16 with a space 17 therebetween. The sections 8 and 10 of the thermostatically controlled chamber are also provided with end spaces 18 accomodating air guide means, such as baffles 19. Each of the sections 8, 9, 10 of the thermostatically controlled chamber is provided with a heating and thermostatic control system comprising means for maintaining a constant temperature of the inner walls 15, or means for maintaining a constant temperature in the spaces 17. This means comprises, individually for each section, a blower 20 and an air heater 21 having an electric heater 22. The temperature is measured by means of thermocouples 23 which are mounted either on the inner walls 15 as shown in FIG. 1, or in the spaces 17 (not shown). In the case, where the thermocouples 23 are mounted in the spaces 17, a constant air temperature in these spaces 17 is maintained so that the influence of changes in the embient temperature conditions is eliminated; where the thermocouples 23 are mounted on the inner walls 15, a constant temperature is ensured on the metallic wall 15 which represents the surface of the direct heat removal from the autoclave 1 to the environment, whereby a constant heat removal conditions are obtained during the entire growing cycle, and the influence of fluctuations of the environment temperature on the temperature fields of the crystallization zone 2 and the dissolution zone 3 of the autoclave 1 is eliminated.

Each thermocouple 23 is connected, via a control instrument 24, to an actuating mechanism 25, and the electric heaters 22 are connected to a thyristor control device 26. The heating elements 7 of the autoclave 1 are connected to the mains via a control device 27 comprising a magnetic amplifier, a thyristor unit or autotransformer, and a voltage stabilizer 18. In addition, the heating elements 8 are connected to a control device 29 which, in its turn, receives a signal directly from the internal cavity of the autoclave 1 from a temperature or pressure transducer.

Figure 2:
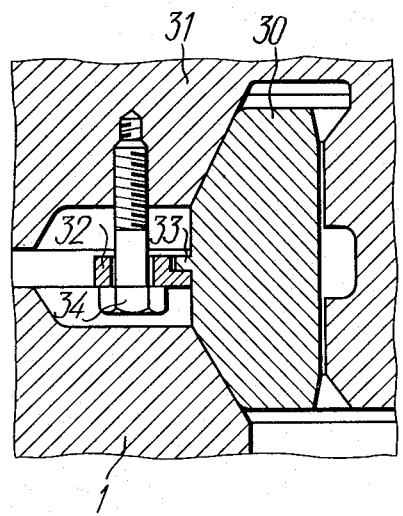
FIG. 2 is an enlarged view of a sealing assembly of the locking portion of the autoclave.

The locking portion of the autoclave 1 should ensure reliable operation under high pressure and during long-term operation cycles under the thermostatic control conditions. For that reason a radial self-sealing lock is used to seal the autoclave 1. This lock comprises a double-cone shutter 30 (FIG. 2) and a cover 31 which are fixed together by means of a ring 32 being against a projection 33 of the shutter 30, and screws 34. The cover 31 is attached to the autoclave 1 by means of studs 35 (FIG. 1) and nuts 36.

The autoclave 1, together with heat insulation layers 4, 5, 6 and the thermostatically controlled chamber, is accommodated in an autonomous case 37.

The above-described apparatus for growing crystals from hydrothermal solutions functions as follows.

The creation of the desired temperature fields and mass exchange conditions in the crystallization zone 2 accommodating seeding plates and in the dissolution zone 3 accommodating a charge (the charge and seeding plates are not shown) is accomplished by a combination selection of power supplied to the heating elements 7, the degree of closing of the diaphragm 11, the shape and material of the heat insulation layers 4, 5, 6 and the temperature of the sections 8, 9, 10 of the thermostatically controlled chamber.

Stable crystallization conditions are maintained in the following manner. The blowers 20 permanently maintain an air flow through the air heaters 21 and spaces 17 of the sections 8, 9, 10 of the thermostatically controlled chamber. The air heated by the electric heaters 22 of the air heaters 21 washes the walls 15 and 16 of the sections 8, 9, 10. The thermocouples 23 monitor the temperature of the inner wall 15. Upon deviation of this temperature from the reference value the control instruments 24 will change the flow rate of the air flowing through the spaces 17 of the sections 8, 9, 10 of the thermostatically controlled chamber by means of the actuating mechanisms 25 to restore a preset temperature of the inner wall 15.

The thyristor control devices 26 make it possible to set up such power input at the electric heaters 22 which ensures the most efficient maintenance of stable temperature in the sections 8, 9, 10 of the thermostatically controlled chamber.

The desired temperature values in the sections 8, 9, 10 of the thermostatically controlled chamber may also be maintained with a constant air flow due to the variation of power supplied to the electric heaters 22, as well as by using the combination of the both methods.

Therefore, the influence of daily, seasonal fluctuations of the temperature of the environment, as well as fluctuations due to the technical reasons (e.g. due to a change in the number of simultaneously operating autoclaves 1 or of those beginning to operate) is eliminated.

The apparatus according to the invention is especially useful where the autoclave 1 has thick walls and considerable weight, and hence a greater thermal inertia, so that the efficiency of the apparatus according to the invention in such cases will be increased. This is due to the fact that under fluctuations of the environment temperature a system of the thermostatically controlled chamber, which has low thermal inertia, containing air and having thin metallic walls 15 and 16 radiating the heat, will return to a preset temperature during the control process long before the temperature of a great mass of the autoclave 1, which is additionally provided with the heat insulation layers 4, 5, 6 having very high thermal inertia, is changed to any significant extent.

When conducting the production growing cycle, power supplied to the heating elements 7 is such as to establish steady heat exchange conditions between the autoclave 1 and the thermostatically controlled chamber with predetermined parameters (pressure and temperature) in the crystallization zone 2 and the dissolution zone 3. Constant air temperature in the sections 8, 9, 10 of the thermostatically controlled chamber, as well as an unchanged power supplied to the heating elements 7 are very efficient for maintenance of the stability of temperature fields in the autoclave 1 created in the desired manner. In its turn, this creates favourable conditions for growing high-grade crystals. However, taking into account the long duration of the growing cycle, there is provided a possibility of controlling the power supplied to the heating elements 7 by means of the control device 27. The use of the thermostatically controlled chamber and the stabilization of the network supplying the heating elements 7 enables the performance of this control operation by very small steps so that the deviations of the stability of crystal growing fields during the control operation are substantially eliminated, whereby very uniform crystals are obtained.

In view of the long duration of the production cycles there is provided the duplication of some instruments and devices in the automatic control system, as well as of the blowers and heating elements (not shown in the drawings).

The embodiment shown in FIG. 1 incorporates a three-section thermostatically controlled chamber. The selection of the sections 8, 9, 10 of the thermostatically controlled chamber is dictated by the necessity of ensuring different temperature conditions in the dissolution zone 3, crystallization zone 2 and in the locking portion of the autoclave 1 so as to relieve the operating conditions of critical threaded fasteners.

However, the invention provides for the possibility of using a large variety of systems for maintenance of constant temperature values in the thermostatically controlled chamber at the desired boundaries with the environment, including the temperature at the surface of the autoclave 1 and its heat insulation layers 4, 5, 6. For that purpose the use may be made of gas, steam, liquid, electric and the like systems having a required number of sections.

Furthermore, taking into account the peculiar feature of the production process associated with the necessity of the heat removal from the crystallization zone 2 only with minimum heat losses from the dissolution zone 3, the use may be made of an apparatus in which the sections of the thermostatically controlled chamber embrace only the crystallization zone 2 and the locking portion of the autoclave 1, while the dissolution zone 3 may be provided with a very reliable heat insulation layer 4 only, so as to substantially eliminate the influence of fluctuations of the environment temperature on the temperature fields in the dissolution zone 3 due to its high thermal resistance. Such apparatus can be the most efficiently used where the autoclave 1 is accommodated in an autonomous case 37.

High stability of maintenance of the temperature fields in the autooclave 1 of the apparatus according to the invention during the entire crystallization cycle makes it possible to grow a crystal which is substantially free from the zonary non-uniformity.

What is claimed is:

1. Apparatus for growing crystals from hydrothermal solution, comprising: a vertically elongated autoclave; a crystallization zone in the top portion of said autoclave; a dissolution zone in the bottom portion of said autoclave; a heat insulation coating of said autoclave; a system of heating elements of said autoclave; a temperature controlled chamber accommodating said autoclave, said chamber being divided into three sections disposed one above another along the vertical extent of said chamber; a heating and temperature control system of each of said sections which ensures the maintenance of constant and different temperature values in each of said sections required for creation and maintenance of the desired temperature fields in said crystallization and dissolution zones of said autoclave, said sections of the temperature controlled chamber each having double walls including an inner and outer walls with a space defined therebetween; and means for maintaining a constant temperature in said space and of said inner wall and comprising said heating and temperature control system.

2. Apparatus for growing crystals from hydrothermal solutions comprising: a vertically elongated autoclave; an upper locking portion of said autoclave; a crystallization zone in the top portion of said autoclave; a dissolution zone in the bottom portion of said autoclave; a heat insulation coating of said autoclave; a system of heating elements of said autoclave; a temperature controlled chamber accommodating said autoclave said chamber being divided into three sections, each section having double walls including an inner and outer walls with a space defined therebetween; a top section of said temperature controlled chamber embracing said locking portion of said autoclave; an intermediate section of said temperature controlled chamber embracing said crystallization zone of said autoclave; a bottom section of said temperature controlled chamber embracing said dissolution zone of said autoclave; a heating and temperature control system of each of said sections for maintaining constant and different temperature values in said space and of said inner wall of each of said sections.

* * * * *